United States Patent
Yahata et al.

(10) Patent No.: US 11,269,085 B2
(45) Date of Patent: Mar. 8, 2022

(54) RADIATION MEASUREMENT DEVICE

(71) Applicant: Mitsubishi Electric Corporation, Tokyo (JP)

(72) Inventors: Hidetaka Yahata, Tokyo (JP); Toshimitsu Nakai, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/267,646

(22) PCT Filed: Aug. 17, 2018

(86) PCT No.: PCT/JP2018/030504
§ 371 (c)(1),
(2) Date: Feb. 10, 2021

(87) PCT Pub. No.: WO2020/035937
PCT Pub. Date: Feb. 20, 2020

(65) Prior Publication Data
US 2021/0173099 A1    Jun. 10, 2021

(51) Int. Cl.
*G01R 29/02* (2006.01)
*H03K 21/02* (2006.01)
*G01T 1/17* (2006.01)

(52) U.S. Cl.
CPC ............ *G01T 1/17* (2013.01); *G01R 29/02* (2013.01); *H03K 21/026* (2013.01)

(58) Field of Classification Search
CPC ........... G01T 1/17; G01T 3/00; H03K 21/026; G01R 29/02
See application file for complete search history.

(56) References Cited

U.S. PATENT DOCUMENTS

2007/0114427 A1* 5/2007 Aoki ................. G01T 1/249
  250/370.09
2015/0083913 A1* 3/2015 Kinugasa ............ G01T 1/171
  250/336.1

FOREIGN PATENT DOCUMENTS

JP    2014001951 A    1/2014

OTHER PUBLICATIONS

International Search Report (PCT/ISA/210) with translation and Written Opinion (PCT/ISA/237) dated Oct. 30, 2018, by the Japan Patent Office as the International Searching Authority for International Application No. PCT/JP2018/030504.

* cited by examiner

*Primary Examiner* — David P Porta
*Assistant Examiner* — Carolyn Fin
(74) *Attorney, Agent, or Firm* — Buchanan Ingersoll & Rooney PC

(57) ABSTRACT

First and second pulse height detection circuits output pulse height detection signals which rise when a detection pulse obtained from a radiation detector becomes greater than a lower threshold Lsh or an upper threshold Hsh, and fall when the detection pulse is smaller than the lower threshold Lsh or the upper threshold Hsh. Next, first and second rising and falling detection circuits detect rising and falling edges of the pulse height detection signals from the first and second pulse height detection circuits in synchronization with a clock pulse from a crystal oscillator, and a combining circuit outputs a signal corresponding to the detection pulse that is within a range between the lower threshold Lsh and the upper threshold Hsh by combining both outputs from the first and second rising and falling detection circuits, in synchronization with the clock pulse.

2 Claims, 9 Drawing Sheets

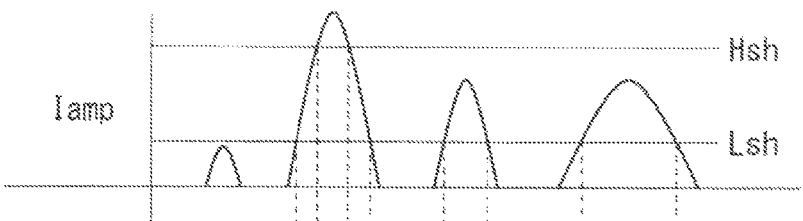
FIG. 2(a)  Iamp
FIG. 2(b)  IN-LO
FIG. 2(c)  IN-HI
FIG. 2(d)  LO
FIG. 2(e)  HI
FIG. 2(f)  LO-D
FIG. 2(g)  HI-D
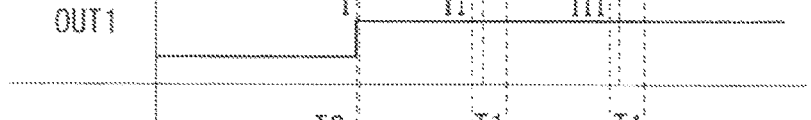
FIG. 2(h)  OUT1
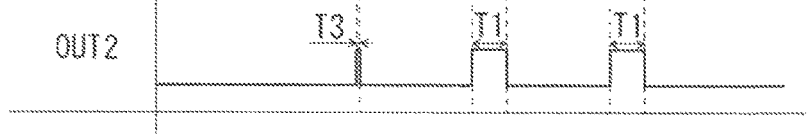
FIG. 2(i)  OUT2

FIG. 3

| STATE | INPUT | | | OUTPUT |
|---|---|---|---|---|
| | T | J | K | Q |
| I | ↓ | H | H | Toggle: INVERTED L→H |
| II | ↓ | H | L | H |
| III | ↓ | H | L | H |

↓: FALLING EDGE OF CLOCK PULSE

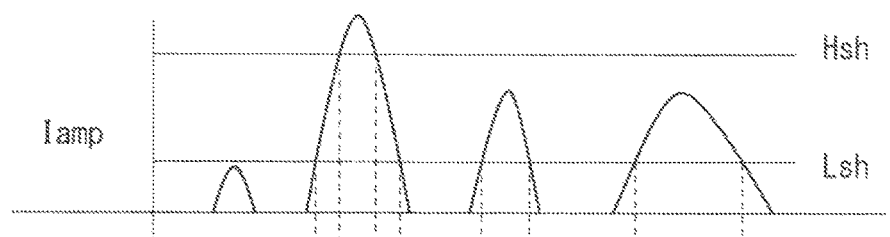
FIG. 6(a) Iamp
FIG. 6(b) IN-LO
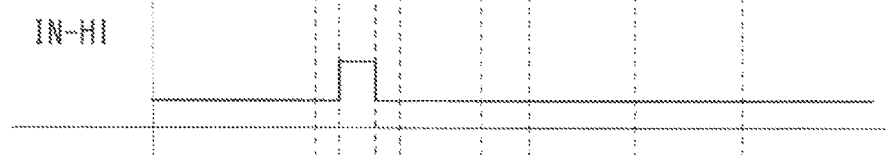
FIG. 6(c) IN-HI
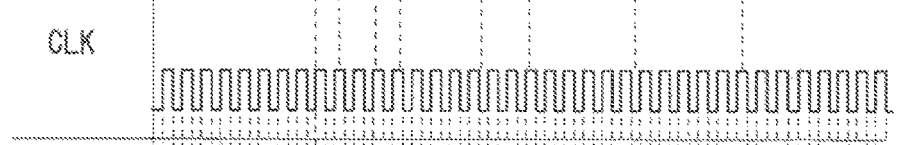
FIG. 6(d) CLK
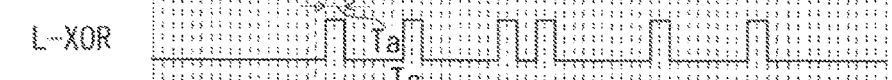
FIG. 6(e) L-XOR
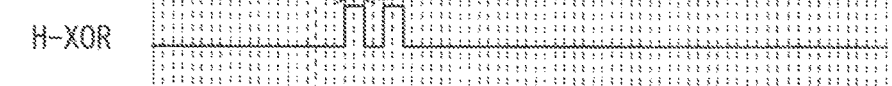
FIG. 6(f) H-XOR
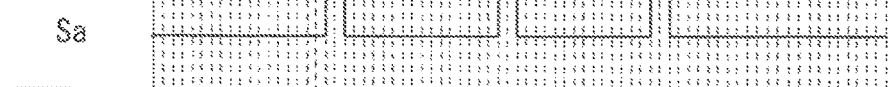
FIG. 6(g) Sa
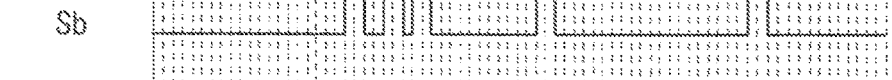
FIG. 6(h) Sb
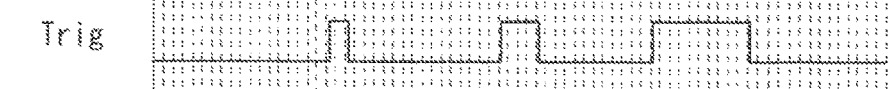
FIG. 6(i) Trig
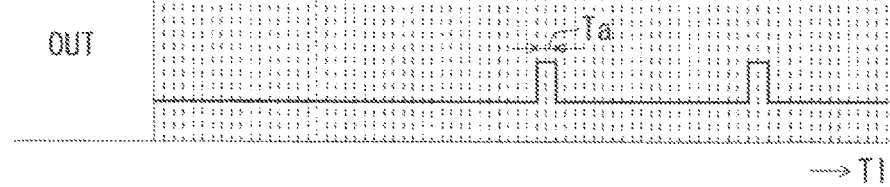
FIG. 6(j) OUT
→ TIME

FIG. 7

| STATE | INPUT | | | OUTPUT |
|---|---|---|---|---|
| | T | J | K | Q |
| I | ↓ | L | L | $Q_0$:NO CHANGE |
| II | ↓ | H | L | H |
| III | ↓ | L | H | L |
| IV | ↓ | H | H | Toggle:INVERTED |

↓ :FALLING EDGE OF CLOCK PULSE

RADIATION MEASUREMENT DEVICE

TECHNICAL FIELD

The present disclosure relates to a radiation measurement device for measuring a detection pulse obtained by a radiation detector.

BACKGROUND ART

In general, in a radiation measurement device, after a detection pulse obtained by a radiation detector is amplified by an amplifier, only detection pulses within a range between lower and upper thresholds (Lsh, Hsh, where Lsh<Hsh) set in advance are extracted by a pulse height selection circuit in order to remove noise components and the like, and the extracted detection pulses are counted to measure the intensity of radiation.

A conventional pulse height selection circuit is formed by a one-shot multivibrator having elements such as a resistor E and a capacitor C, and a delay circuit using a response time of a logic IC having elements such as a capacitor C and a reactor L, thus achieving a function of extracting detection pulses within a range between the lower and upper thresholds (Lsh, Hsh) (see, for example, Patent Document 1).

CITATION LIST

Patent Document

Patent Document 1: Japanese Laid-Open Patent Publication No. 2014-1951

SUMMARY OP THE INVENTION

Problems to be Solved by the Invention

As described above, the poise height selection circuit in the conventional radiation measurement device is termed by a one-shot multivibrator having elements such as a resistor R and a capacitor C, and a delay circuit using a response time of a logic IC having elements such as a capacitor C and a reactor L. Therefore, there is a problem that, due to variation in characteristics of the elements such as the resistor R and the capacitor C, the pulse width of an output pulse from the one-shot multivibrator or the delay time of the delay circuit is not stable. As a result, for example, count loss of detection pulses occurs or unnecessary detection pulses that should be excluded through pulse height selection are also measured, thus causing a fault such as occurrence of error in a measurement result.

The present disclosure has been made to solve the above problem, and an object of the present disclosure is to provide a radiation measurement device that can always stably and assuredly extract only detection pulses within a range between the lower and upper thresholds (Lsh, Hsh) from detection pulses obtained by a radiation detector, thus enabling more accurate measurement for the intensity of radiation than conventional art.

Solution to the Problems

A radiation measurement device according to the present disclosure includes: a first pulse height detection circuit for outputting a first pulse height detection signal which rises when a detection pulse outputted from a radiation detector becomes greater than a lower threshold Lsh, and falls when the detection pulse becomes smaller than the lower threshold Lsh; a second pulse height defection circuit for outputting a second pulse height detection signal which rises when the detection pulse outputted from the radiation detector becomes greater than an upper threshold Hsh greater than the lower threshold Lsh, and falls when the detection pulse becomes smaller than the upper threshold Hsh; a crystal oscillator for generating a clock pulse with a certain cycle; a first rising and falling detection circuit for detecting both rising and falling edges of the first pulse height defection signal outputted from the first pulse height detection circuit, in synchronisation with the clock pulse from the crystal oscillator; a second rising and falling detection circuit, for detecting both rising and foiling edges of the second pulse height detection signal outputted front the second pulse height detection circuit, in synchronization with the clock pulse from the crystal oscillator; and a combining circuit for outputting a signal corresponding to the detection pulse that is within a range between the lower threshold Lsh and the upper threshold Hsh, by combining an output from the first rising and falling detection circuit and an output from the second rising and falling defection circuit, in synchronisation with the clock pulse from the crystal oscillator.

Effect of the Invention

In the radiation measurement device according to the present disclosure, with respect to detection pulses obtained by the radiation detector, only a defection pulse having a pulse height value within a range between the lower threshold Lsh and the upper threshold Hsh can be always stably and assuredly extracted in synchronization with the clock pulse from the crystal oscillator, thus enabling accurate measurement for the intensity of radiation.

BRIEF DESCRIPTION OF THE DRAWINGS

FIG. 2 is a timing chart for illustrating operation of the radiation measurement device in the reference example for the present disclosure.

FIG. 3 shows a truth table of the radiation measurement device in the reference example of the present disclosure.

FIG. 6 is a timing chart for illustrating operation of the radiation measurement device according to embodiment 1.

FIG. 7 shows a truth table of the radiation measurement device according to embodiment 1.

DESCRIPTION OF EMBODIMENTS

For the purpose of further understanding of the contents of the present disclosure, the configuration of technology as a reference for the present disclosure and a problem thereof will be described below in advance.

Figure 1:
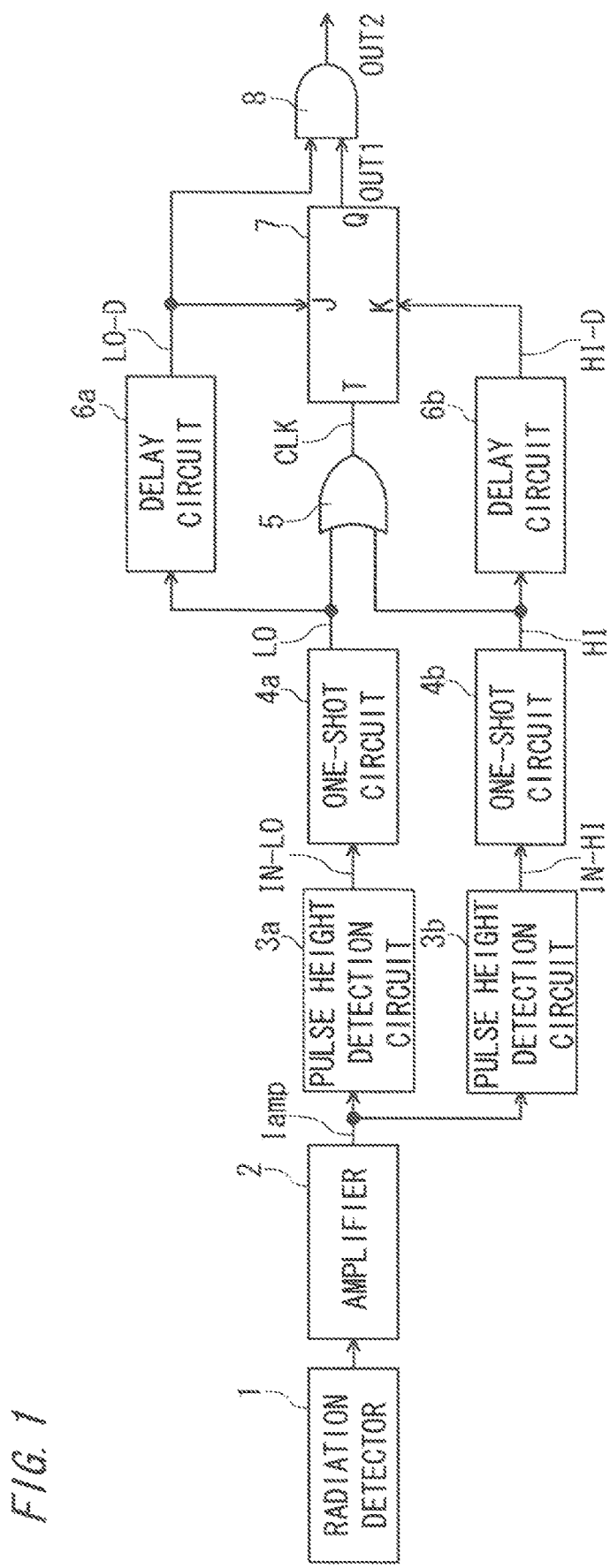
FIG. 1 is a block diagram showing the schematic configuration of a radiation measurement device in a reference example for the present disclosure.

FIG. 1 is a block diagram showing the schematic configuration of a radiation measurement device in a reference example for the present disclosure, and FIG. 2 is a timing chart for illustrating operation of the radiation measurement device in the reference example for the present disclosure.

The radiation measurement, device as the reference example in FIG. 1 includes a radiation detector 1, an amplifier 2, a first pulse height detection circuit 3a, a second pulse height detection circuit 3b, a first one-shot circuit 4a, a second one-shot circuit 4b, an OF circuit 5, a first delay circuit 6a, a second delay circuit 6b, a combining circuit 7, and an AND circuit 8. It is noted that the latter stage circuit excluding the radiation defector 1 and the amplifier 2 corresponds to a pulse height selection circuit.

The radiation defector 1 is formed from, for example, a scintillation counter, a semiconductor detector, or the like, and outputs a defection pulse in accordance with the intensity of radiation. The amplifier 2 outputs a detection pulse Iamp obtained by amplifying the detection pulse detected by the radiation defector 1 to a predetermined level, as shown in (a) of FIG. 2.

The first pulse height detection circuit 3a outputs a first pulse height detection signal IN-LO which rises when the signal level of the detection pulse Iamp amplified by the amplifier 2 becomes greater than a certain lower threshold Lsh set in advance, and falls when the signal level becomes smaller than the lower threshold Lsh, as shown in (b) of FIG. 2. The second pulse height detection circuit 3b outputs a second pulse height detection signal IN-HI which rises when the signal level of the detection pulse Iamp amplified by the amplifier 2 becomes greater than a certain upper threshold Hsh (Hsh>Lsh) set in advance, and falls when the signal level becomes smaller than the upper threshold Hsh, as shown in (c) of FIG. 2.

The first one-shot circuit 4a is formed from a monostable one-shot multivibrator having elements such as a resistor R and a capacitor C, and outputs a pulse signal LO having a predetermined pulse width T1 in accordance with rising of the first pulse height detection signal IN-LO from the first pulse height detection circuit 3a, as shown in (d) of FIG. 2. Similarly, the second one-shot circuit 4b is formed from a monostable one-shot multivibrator having elements such as a resistor P and a capacitor C, and outputs a pulse signal HI having a predetermined pulse width T1 in accordance with rising of the second pulse height detection signal IN-HI, as shown in (e) of FIG. 2.

The OR circuit 5 combines the output LO of the first one-shot circuit 4a and the output HI of the second one-shot circuit 4b, and outputs both as a clock pulse CLK.

The first delay circuit 6a is formed from a logic IC having elements such as a capacitor G and a reactor L, and outputs a poise signal LO-D delayed by a certain time 72 from the poise signal LO outputted from the first one-shot circuit 4a, as shown in (f) of FIG. 2. Similarly, the second delay circuit 6b is formed from a logic IC having elements such as a capacitor C and a reactor L, and outputs a pulse signal HI-D delayed by the certain time T2 from the pulse signal HI outputted from the second one-shot circuit 4b, as shown in (g) of FIG. 2.

The combining circuit 7 is formed from, in this example, a JK flip-flop, and is configured such that the pulse signal LO-D outputted from the first delay circuit 6a is inputted to a J input terminal, the pulse signal HI_D outputted from the second delay circuit 6b is inputted to a K input terminal, and the pulse signal LO outputted from the first one-shot circuit 4a and the pulse signal HI outputted from the second one-shot circuit 4b are both inputted through the OR circuit 5 as the clock pulse CLK to a sampling terminal T. As a result, a rectangular-wave signal OUT1 as shown in (h) of FIG. 2 is outputted from an output terminal Q of the combining circuit 7 in accordance with a truth table shown in FIG. 3.

The AMD circuit 8 makes a logical conjunction of the output signal OUT1 from the combining circuit 7 and the pulse signal LO-D outputted from the first delay circuit 6a, and a pulse signal OUT2 as shown in lip of FIG. 2 is outputted from the AND circuit 8.

Here, when the pulse height value of the pulse signal Iamp outputted from the amplifier 2 becomes greater than the upper threshold Hsh, the output OUT2 of the AND circuit 8 has a pulse width T3 shorter than the pulse width T1 of the output LO of the first one-shot circuit 4a, and meanwhile, when the pulse height value of the pulse signal Iamp outputted from the amplifier 2 is within a range between the upper threshold Hsh and the lower threshold Lsh, the output OUT2 of the AND circuit has the same pulse width T1 as the pulse signal LO of the first one-shot circuit 4a.

With respect to the output pulse OUT2 from the AMD circuit 8, thereafter, a signal having a pulse width smaller than the pulse width T1 is excluded by a pulse width selection circuit (not shown). Therefore, finally, only pulses in the case where the pulse height value of the pulse signal Iamp outputted from the amplifier 2 is within a range between the upper threshold Hsh and the lower threshold Lsh, are extracted.

However, as described above, the first one-shot circuit 4a and the second one-shot circuit 4b have elements such as the resistor R and the capacitor C, and the first delay circuit 6a and the second delay circuit 6b are configured using a response time of the logic IC having elements such as the capacitor C and the reactor L. Therefore, due to variation in characteristics of these elements, the pulse widths of the output pulses LO, HI of the first one-shot circuit 4a and the second one-shot circuit 4b, or the delay times T2 of the first delay circuit 6a and the second delay circuit 6b, are not stable. As a result, for example, count loss of detection pulses occurs or unnecessary detection pulses that should be excluded through pulse height selection are also measured, thus causing a fault such as occurrence of error in a measurement result. The present disclosure is to provide a radiation measurement device that prevents such a fault. Hereinafter, embodiments of the present disclosure will be described.

Embodiment 1

Figure 4:
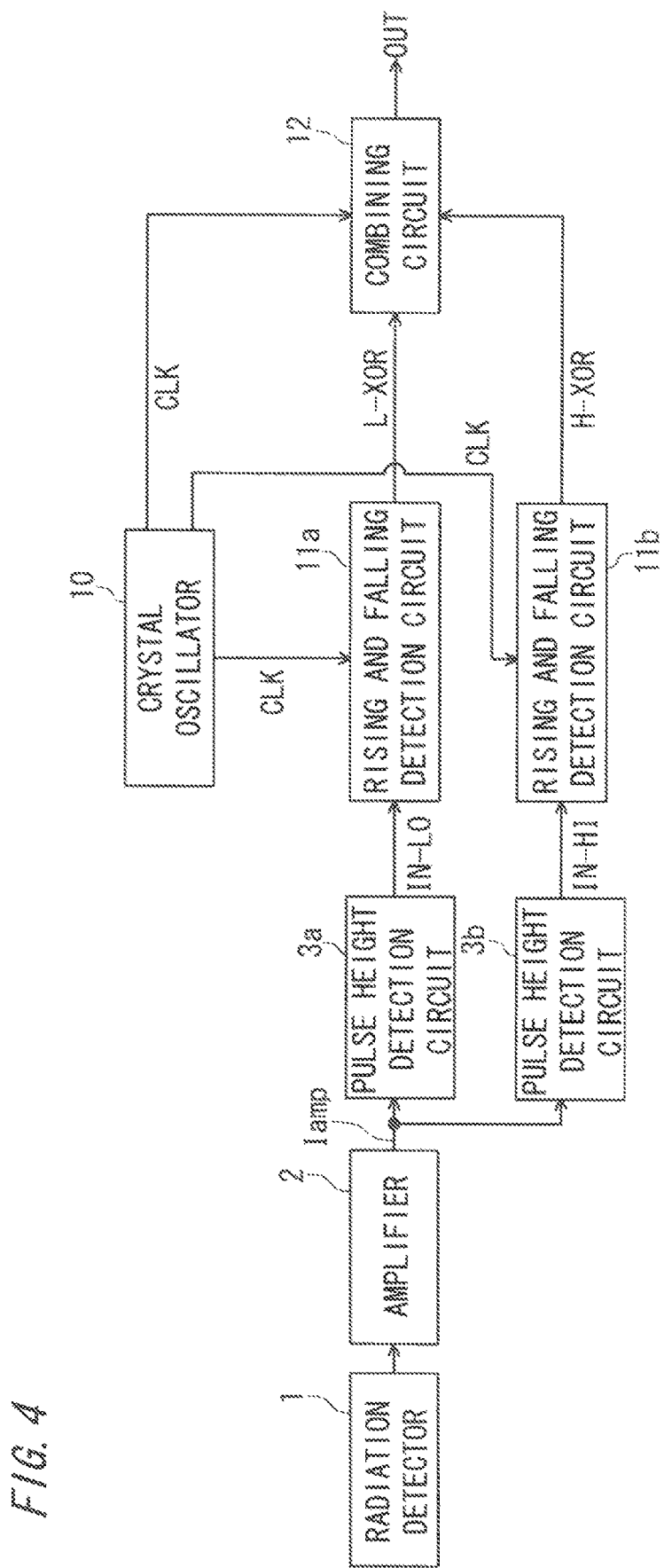
FIG. 4 is a block diagram showing the schematic configuration of a radiation measurement device according to embodiment 1.
Figure 5:
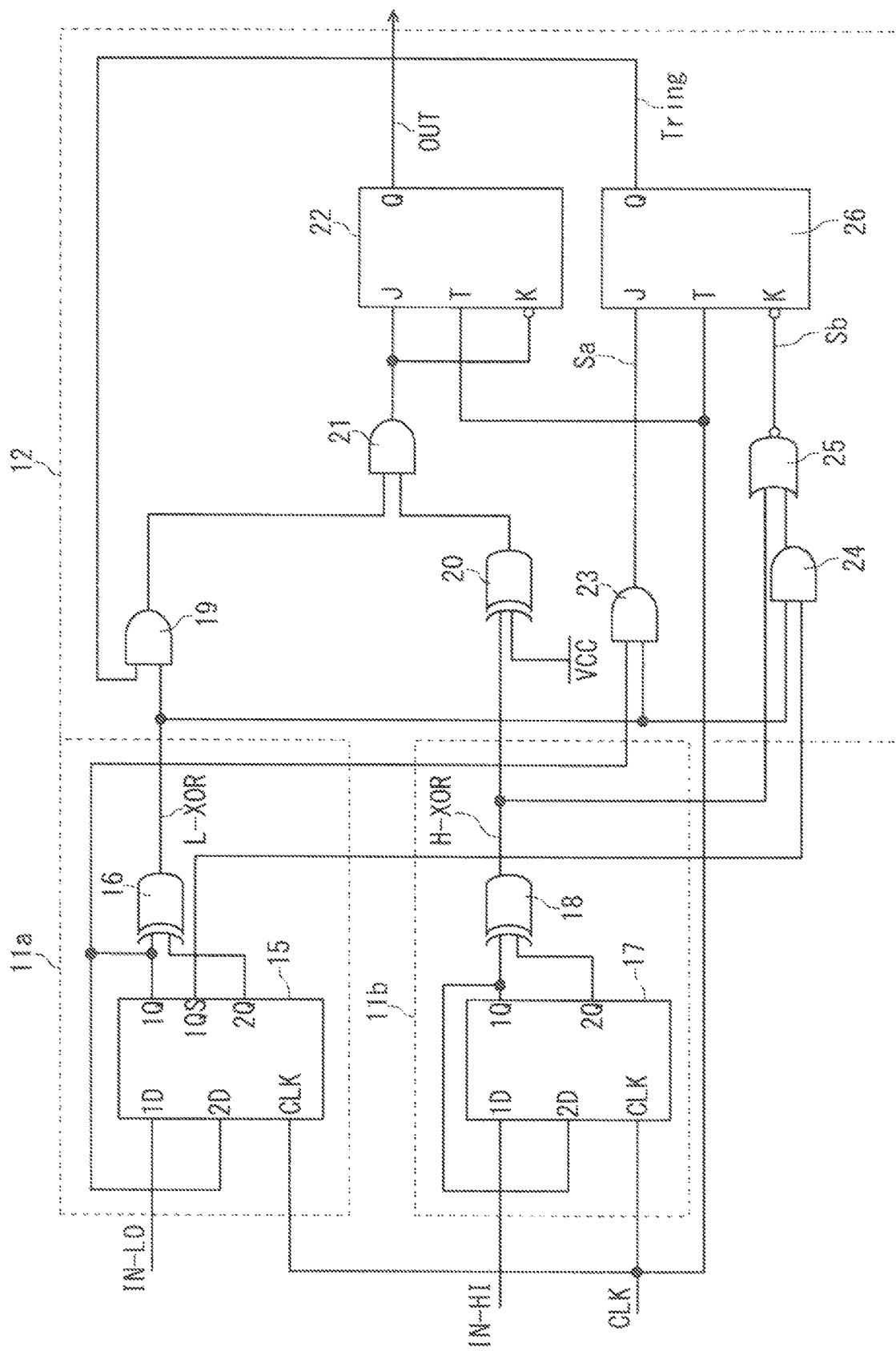
FIG. 5 is a block diagram showing the details of a rising and falling detection circuit and a combining circuit of the radiation measurement device according to embodiment 1.

FIG. 4 is a block diagram showing the schematic configuration of a radiation measurement device according to embodiment 1, and FIG. 5 is a block diagram showing the details of a rising and falling detection circuit and a combining circuit of the radiation measurement device according to embodiment 1. FIG. 6 is a timing chart for illustrating operation of the radiation measurement device according to embodiment 1.

The radiation measurement device of embodiment 1 includes a radiation detector 1, an amplifier 2, a first pulse height detection circuit 3a, a second pulse height detection circuit 3b, a crystal oscillator 10, a first rising and falling detection circuit 11a, a second rising and falling detection circuit 11b, and a combining circuit 12.

The radiation detector 1 is formed from, for example, a scintillation counter, a semiconductor detector, or the like, and outputs a detection pulse m accordance with the intensity of radiation. The amplifier 2 outputs a detection pulse Iamp obtained by amplifying the detection pulse from the radiation detector 1 to a predetermined level, as shown in (a) of FIG. 6.

The first pulse height detection circuit 3a outputs a first pulse height detection signal IN-LO which rises when the signal level of the amplified detection pulse Iamp becomes greater than a certain lower threshold Lsh set in advance, and falls when the signal level becomes smaller than the certain lower threshold Lsh, as shown in (b) of FIG. 6. The second pulse height detection circuit 3b outputs a second pulse height detection signal IN-HI which rises when this signal level of the detection pulse Iamp amplified becomes greater than a certain upper threshold Hsh (Hsh>Lsh) set in advance, and falls when the signal level becomes smaller than the certain upper threshold Hsh, as shown in (c) of FIG. 6.

The crystal oscillator 10 outputs a clock pulse CLK having a stable constant frequency as shown in (d) of FIG. 6.

The first rising and falling detection circuit 11a is, as shown in FIG. 5, formed from a D flip-flop 15 and an XOR circuit (exclusive disjunction circuit) 16, and as shewn in (e) of FIG. 6, detects rising and falling edges of the first pulse height detection signal IN-LO from the first pulse height detection circuit 3a in synchronisation with the clock pulse CLK from the crystal oscillator 10, and according to each detection, outputs a pulse signal L-XOR having a certain pulse width Ta.

The second rising and falling detection circuit 11b is, as shown m FIG. 5, formed from a D flip-flop 17 and an XOR circuit (exclusive disjunction circuit) 18, and as shown in (f) of FIG. 6, detects a rising edge and a falling edge of the second pulse height detection signal IN-HI from the second pulse height detection circuit 3b in synchronization with the clock pulse CLK from the crystal oscillator 10, and according to each detection, outputs a pulse signal H-XOR having the certain pulse width Ta.

The combining circuit 12 receives the pulse signal L-XOR outputted from the first rising and falling detection circuit 11a and the pulse signal H-XOR outputted from the second rising and falling detection circuit 11b, and finally, only when the pulse height value of the pulse signal Iamp outputted from the amplifier 2 is within a range between the upper threshold Hsh and the lower threshold Lsh described above, the combining circuit 12 outputs a signal OUT corresponding thereto as shown in (j) of FIG. 6, in synchronization with the clock pulse CLK from the crystal oscillator 10.

FIG. 5 shows specific details of the combining circuit 12 for realizing the above function.

The combining circuit 12 in embodiment 1 includes a first AND circuit 19, an XOR circuit 20, a second AMD circuit 21, a first JK flip-flop 22, a third AND circuit 23, a fourth AMD circuit 24, a NOB circuit (joint denial circuit) 25, and a second JK flip-flop 26.

Output of the first AND circuit 19 is "H" when the pulse signal L-XOR outputted from the first rising and falling detection circuit 11a and a later-described pulse signal Trig outputted from the second JK flip-flop 26 are both inputted (i.e., when both are "H").

When the pulse signal L_XOR and the pulse signal Trig are both inputted to the first AMD circuit 19 (i.e., both are "H") and the pulse signal H-XOR is not outputted from the second rising and falling detection circuit 11b (i.e., the output Iamp of the amplifier 2 is not greater than the upper threshold Hsh), output of the XOR circuit 20 is "H" and therefore output of the second AND circuit 21 is also "H". On the other hand, even when the pulse signal L_XOR end the pulse signal Trig are both inputted to the first AMD circuit 19, if the pulse signal H-XOR is outputted from the second rising and falling detection circuit 11b (i.e., the output Iamp of the amplifier 2 is greater than the upper threshold Hsh), output of the XOR circuit 20 is "L" and therefore output of the second AND circuit 21 is also "L".

In the first JX flip-flop 22, output of the second AND circuit 21 is inputted to both of a J input terminal and a K input terminal, and the clock pulse CLK from the crystal oscillator 10 is inputted to a sampling terminal T. Therefore, in a state in which output of the second AMD circuit 21 is "H", every time the clock pulse CLK is inputted (specifically, at the timing of falling of the clock pulse CLK), the first JK flip-flop 22 accordingly outputs the pulse signal OUT with its level inverted at each time as shown in (j) of FIG. 6, from an output terminal Q thereof.

As shown in (g) of FIG. 6, the third AND circuit 23 extracts, from the pulse signal L-XOR outputted from the first rising and falling detection circuit 11a, a pulse signal generated along with rising of the first pulse height detection signal IN-LO from the first pulse height defection circuit 3a, thus outputting an extracted pulse Sa.

The fourth AND circuit 24 and the NOR circuit (joint denial circuit) 23 extract, from the poise signal L-XOR outputted from the first rising and falling detection circuit 11a, a pulse signal outputted along with falling of the first pulse height defection signal IN-LO from the first pulse height detection circuit 3a, and extract the pulse signal H-XOR outputted from the second rising and falling detection circuit 11b, thus outputting an extracted pulse Sb as shown in (h) of FIG. 6.

In the second JK flip-flop 26, the extracted pulse Sa outputted from the third AMD circuit 23 is inputted to a J input terminal, the extracted pulse Sb outputted from the NOR circuit 23 is inputted to a K input terminal, and the clock pulse CLK from the crystal oscillator 10 is inputted to a sampling terminal T. Therefore, in accordance with a truth table as shown in FIG. 7, every time the clock pulse CLK is inputted (specifically, at the timing of falling of the clock pulse CLK), the second JK flip-flop 26 accordingly outputs a pulse signal Trig as shown in (i) of FIG. 6 from an output terminal Q.

For example, in FIG. 7, in the case where the extracted pulse Sa outputted from the third AND circuit 23 is "H" and the extracted pulse Sb outputted from the NOR circuit 25 is "L", the pulse signal Trig rises at the timing of falling of the clock pulse CLK, and in the case where the extracted pulse Sa outputted from the third AND circuit 23 is "L" and the extracted pulse Sb outputted from the NOR circuit 25 is "H", the pulse signal Trig falls at the timing of falling of the clock pulse CLK.

Thus, from the output terminal Q of the first JK flip-flop 22, as shown in (j) of FIG. 6, only in the case where the pulse height value of the detection pulse Iamp outputted from tire amplifier 2 is between the upper threshold Hsh and the lower threshold Lsh described above, the signal OUT is outputted in synchronization with the clock pulse CLK from the crystal oscillator 10 while the level of the signal OUT is inverted accordingly, and in the case where the pulse height value is out of the range between the upper threshold Hsh and the lower threshold Lsh, the output GUT from the output terminal Q of the first JK flip-flop 22 is inhibited.

As described above, in the radiation measurement device according to the present embodiment 1, with respect to the detection pulses obtained by the radiation detector 1, only when the pulse height value thereof is within a range between the upper threshold Lsh and the lower threshold Hsh, the pulse can be extracted in synchronization, with the clock pulse from the crystal oscillator 10. Thus, it becomes possible to measure the intensity of radiation always stably and assuredly, so that detection accuracy in radiation measurement is enhanced.

Embodiment 2

Figure 8:
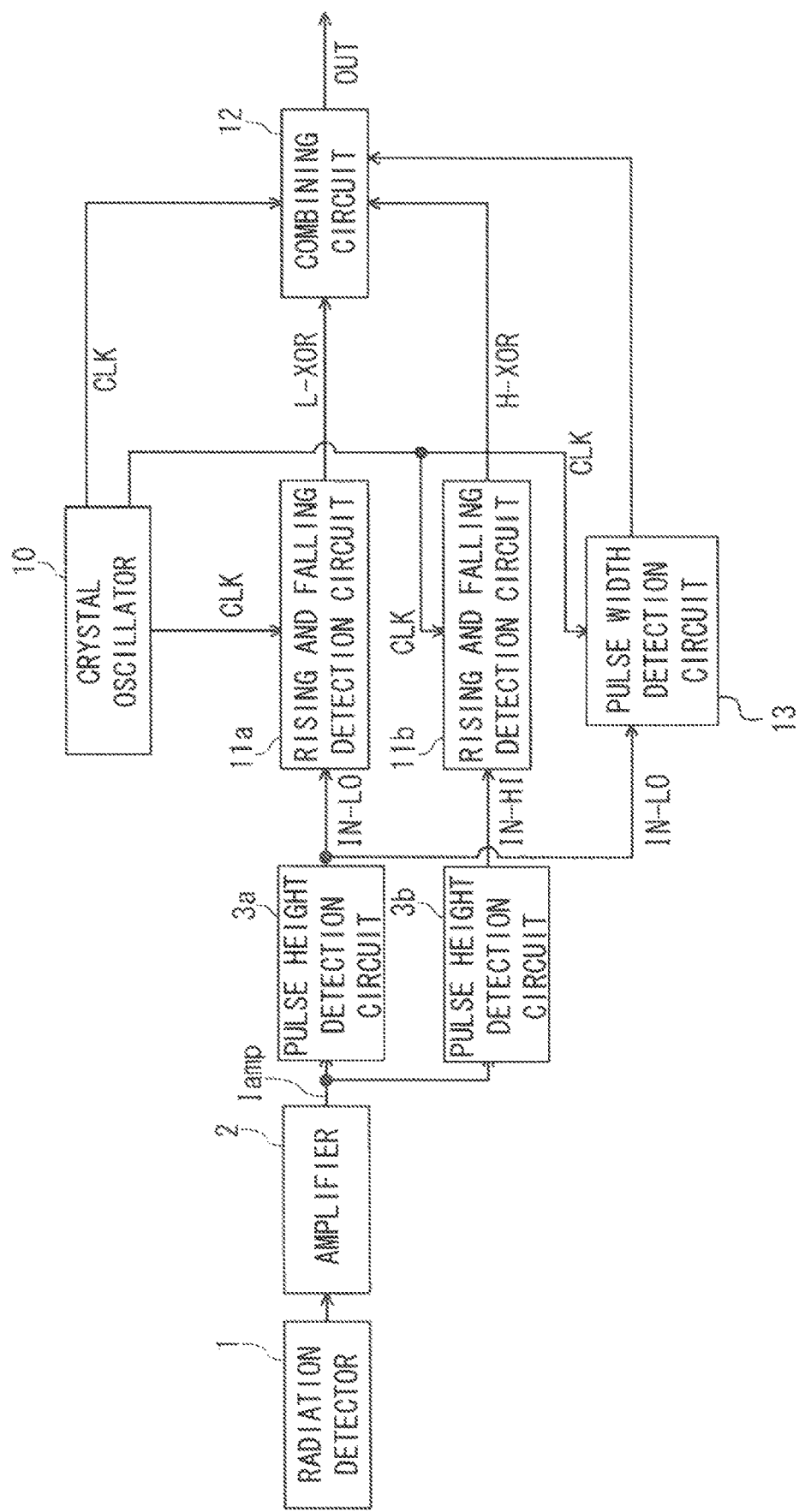
FIG. 8 is a block diagram showing the schematic configuration of a radiation measurement device according to embodiment 2.
Figure 9:
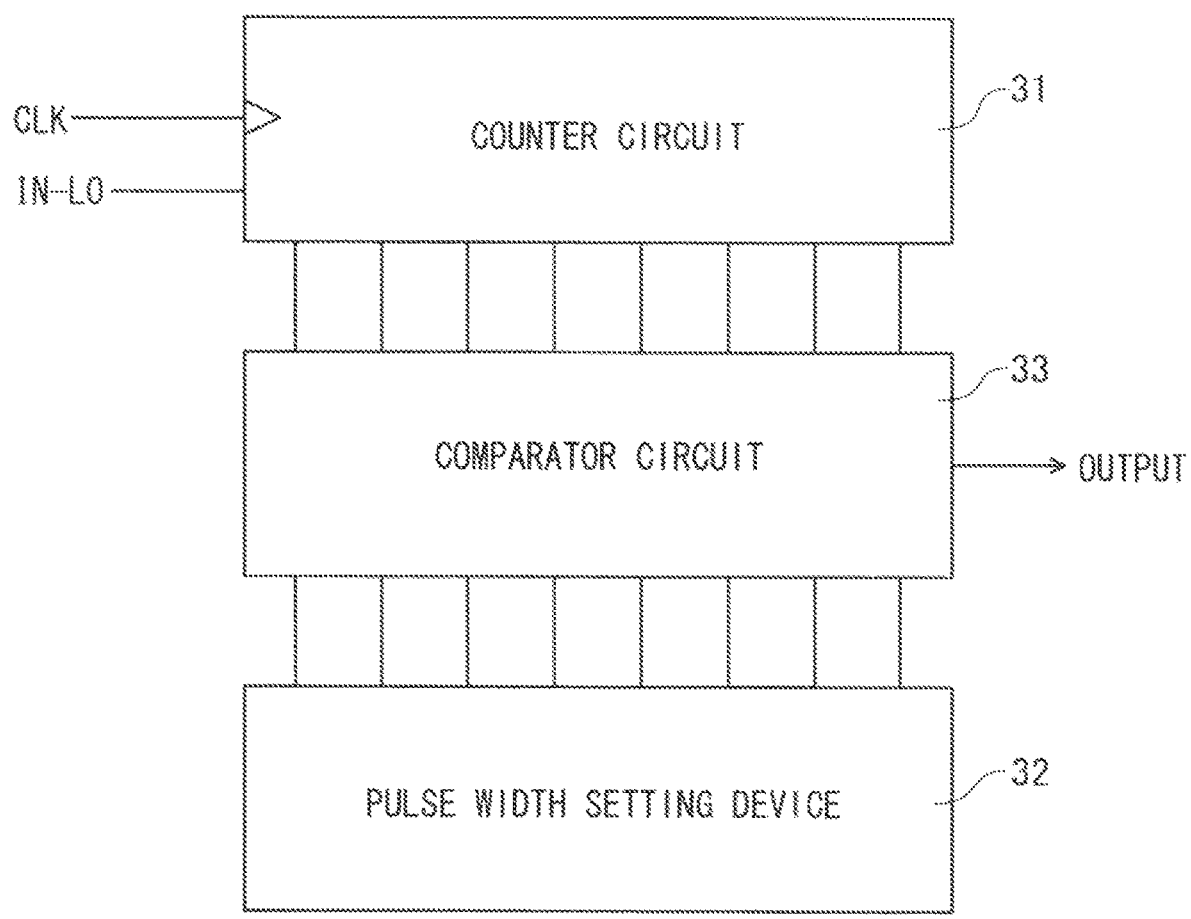
FIG. 9 is a block, diagram showing the details of a pulse width detection circuit of the radiation measurement device according to embodiment 5.

FIG. 8 is a block diagram showing the schematic configuration of a radiation measurement device according to embodiment 2. The components that correspond to or are the same as those of the radiation measurement device in embodiment 1 shown in FIG. A are denoted by the same reference characters. FIG. 9 is a block diagram showing the details of a pulse width detection circuit of the radiation measurement device according to embodiment 2.

The pulse width of the detection pulse obtained by the radiation detector 1 is determined depending on a physical phenomenon, and thus, if a pulse width W of the detection pulse Iamp amplified by the amplifier 2 is greater than a predetermined threshold Wsh, the pulse is considered to be noise. As a factor for causing such noise, it is assumed that, for example, noise is superimposed on cables connecting the radiation detector 1 and various signal processing circuits at a stage subsequent thereto.

Accordingly, in embodiment 2, a pulse width detection circuit 12 is provided which compares the pulse width W of the first pulse height detection signal IN-Lo outputted from the first pulse height detection circuit with a certain threshold Wsh set in advance as a permissible pulse width, and inhibits the pulse output OUT of the combining circuit 12 when the pulse width W of the first pulse height detection signal IN-LG is greater than the threshold Wsh (W>Wsh).

As a specific example, the pulse width detection circuit 13 includes a counter circuit 31, a pulse width setting device 32, and a comparator circuit 33 as shown in FIG. 9.

During a period in which the first pulse height detection signal IN-LO outputted from the first pulse height detection circuit 3a is "H", the counter circuit 31 counts the clock pulses CLK from the crystal oscillator 10 (this count corresponds to the pulse width W of the first pulse height detection signal IN-LO), and the comparator circuit 33 compares a count value C of the above count with a count value Csh set m advance in the pulse width setting device 32 (this count value Csh corresponds to the certain threshold Wsh set as a permissible value).

Then, when the count value C of the counter circuit 31 is smaller than the count value Csh set in advance in the pulse width setting device 32 (i.e., W≤Wsh), & signal of "H" is generated, and when the count value C is greater than the count value Csh (i.e., W>Wsh), a signal of "L" is generated. These signals are outputted to the combining circuit 12 (specifically, second AND circuit 21).

Thus, when output of the pulse width detection circuit 13 is "H", i.e., when the pulse width W of the detection pulse Iamp obtained through the amplifier 2 from the radiation detector 1 is smaller than the predetermined threshold Wsh (W≤Wsh), the pulse output OUT of the combining circuit 12 is permitted, but when output of the pulse width detection circuit 13 is "L", i.e., when the pulse width W of the detection pulse Iamp obtained through the amplifier 2 from the radiation detector 1 is greater than the predetermined threshold Wsh (W>Wsh), the pulse is considered to be noise, so that the pulse output OUT of the combining circuit 12 is inhibited.

The other configurations, operations, and effects are the same as those in embodiment 1, and therefore the detailed description thereof is omitted here.

As described above, in embodiment 2, unnecessary noise components contained in the detection pulse Iamp can be assuredly prevented from being extracted together, whereby it becomes possible to measure the intensity of radiation more accurately than in embodiment 1.

Although the disclosure is described above in terms of various exemplary embodiments and implementations, if should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 radiation defector
2 amplifier
3a first pulse height detection circuit
3b second pulse height detection circuit
10 crystal oscillator
11a first rising and falling detection circuit
11b second rising and falling detection circuit
12 combining circuit
13 pulse width defection circuit
Lsh lower threshold
Hsh upper threshold

The invention claimed is:

1. A radiation measurement device comprising:
a first pulse height detection circuit to output a first pulse height detection signal which rises when a detection pulse outputted from a radiation detector becomes greater than a lower threshold Lsh, and falls when the detection pulse becomes smaller than the lower threshold Lsh;
a second pulse height detection circuit to output a second pulse height detection signal which rises when the detection pulse outputted from the radiation detector becomes greater than an upper threshold Hsh greater than the lower threshold Lsh, and falls when the detection pulse becomes smaller than the upper threshold Hsh;
a crystal oscillator to generate a clock pulse with a certain cycle;
a first rising and falling detection circuit to detect both rising and falling edges of the first pulse height detection signal outputted from the first pulse height detection circuit, in synchronization with the clock pulse from the crystal oscillator;
a second rising and falling detection circuit to detect both rising and falling edges of the second pulse height detection signal outputted from the second pulse height detection circuit, in synchronization with the clock pulse from the crystal oscillator; and a combining circuit to output a signal corresponding to the detection pulse that is within a range between the lower threshold Lsh and the upper threshold Hsh, by combining an output from the first rising and falling detection circuit and an output from the second rising and falling detection circuit, in synchronization with the clock pulse from the crystal oscillator.

2. The radiation measurement device according to claim 1, further comprising a pulse width detection circuit to compare a pulse width of the first pulse height detection signal outputted from the first pulse height detection circuit with a predetermined certain threshold, and inhibiting a signal output from the combining circuit when the pulse width of the first pulse height detection signal is greater than the predetermined threshold.

* * * * *